United States Patent [19]

Otsuka et al.

[11] Patent Number: 5,126,823
[45] Date of Patent: Jun. 30, 1992

[54] LEAD FRAME HAVING AT LEAST TWO ISLANDS AND RESIN MOLDED SEMICONDUCTOR DEVICE USING IT

[75] Inventors: Masashi Otsuka, Yokohama; Toshihiro Kato, Chigasaki, both of Japan

[73] Assignee: Kabushiki Kaisha Toshiba, Kawasaki, Japan

[21] Appl. No.: 662,965

[22] Filed: Mar. 1, 1991

[30] Foreign Application Priority Data

Mar. 6, 1990 [JP] Japan ................................ 2-52815

[51] Int. Cl.⁵ .......................................... H01L 23/48
[52] U.S. Cl. .......................................... 357/70; 357/72; 357/75
[58] Field of Search .............................. 357/70, 72, 75

[56] References Cited

U.S. PATENT DOCUMENTS

| | | | |
|---|---|---|---|
| 4,282,544 | 8/1981 | Nowak | 357/72 |
| 4,750,029 | 6/1988 | Futasuka et al. | 357/70 |
| 4,794,431 | 12/1988 | Park | 357/70 |
| 4,977,441 | 12/1990 | Ohtani et al. | 357/70 |
| 4,977,442 | 12/1990 | Suzuki et al. | 357/70 |

FOREIGN PATENT DOCUMENTS 0294190 12/1988 European Pat. Off. .

OTHER PUBLICATIONS

Japanese Patent Abstract for Appln. No. 58-73144, vol. 9, No. 61 Mar. 19, 1985, application published Nov. 10, 1984.
Japanese Patent Abstract for Appln. No. 58-251388, vol. 9, No. 298 Nov. 26, 1985, application published Jul. 20, 1985.
Japanese Patent Abstract for Appln. No. 57-223267, vol. 8, No. 231 Oct. 24, 1984, application published Jun. 30, 1984.

Primary Examiner—Georgia Y. Epps
Attorney, Agent, or Firm—Finnegan, Henderson, Farabow, Garrett, & Dunner

[57] ABSTRACT

A lead frame for a multichip type semiconductor device includes at least two square or rectangular islands each of which has four sides and is supported by island supports. Each of the sides of the islands is not parallel to each of the sides of the lead frame to reduce an unwanted bend of leads.

21 Claims, 5 Drawing Sheets

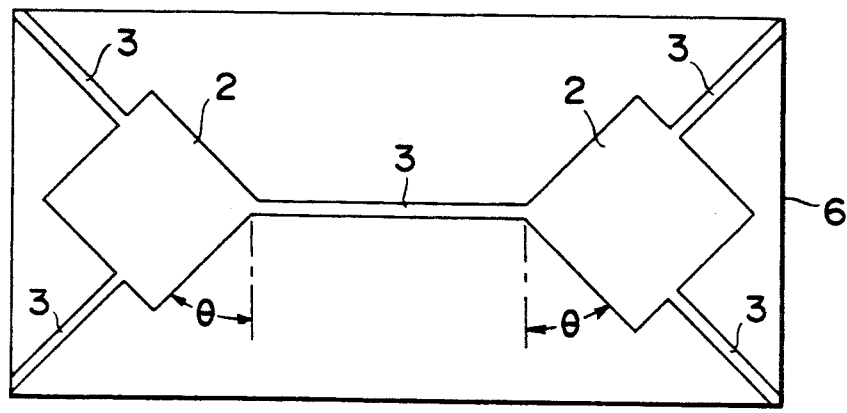
F I G. 2A
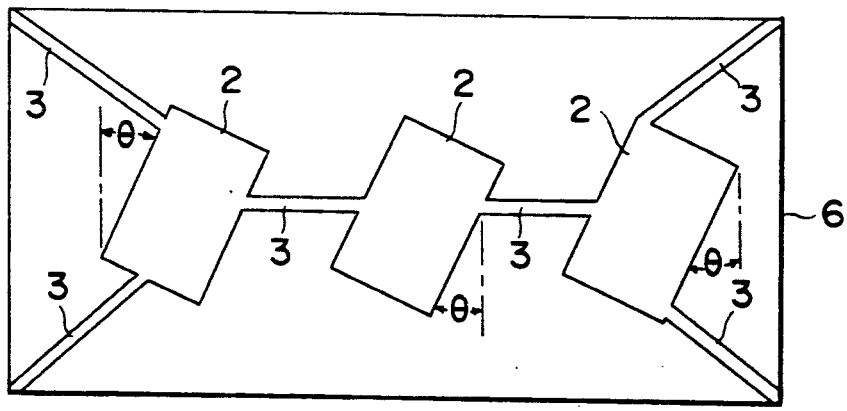
F I G. 2B

LEAD FRAME HAVING AT LEAST TWO ISLANDS AND RESIN MOLDED SEMICONDUCTOR DEVICE USING IT

BACKGROUND OF THE INVENTION

1. Field of the Invention

The present invention relates generally to a multi-chip type semiconductor device, and more particularly to a lead frame for mounting semiconductor chips to provide a multi-pin QFP (Quad Flat Package).

2. Description of the Related Art

With the development in integrated circuits having a high density and advanced functions, a conventional one-chip package system has now been insufficient to meet the present requirements. Under the situation, a multi-chip package system including a plurality of semiconductor chips in one package has been developed.

By virtue of a multi-chip package, high-density packaging is realized. Accordingly, for developing new integrated circuits, only a lead frame need be designed since existing chips are combined to assemble them in one package. Thus, the time for development can be reduced. Such devices as silicon ICs and GaAs devices, or bipolar and C-MOS ICs, which have not easily been assembled in one chip in the prior art, can be incorporated in one chip, resulting in advancement of functions. Further, since these devices are molded be transfer molding, the similar reliability to that of a conventional resin-molded type semiconductor device can be obtained. The usefulness of this type of package is remarkable.

Resin-molded type packages of semiconductor devices such as ICs and LSIs have recently become popular more and more, with a view to reducing the cost and in accordance with the complicated configuration. For providing a multi-chip type package for this type semiconductor device, it is necessary to mount a plurality of chips on a lead frame and to mold them with a resin. FIG. 4 shows an example of a lead frame on which two chips are mounted. The lead frame 1 has rectangular islands 2 at a center to mount rectangular chips thereon. A desired one of the sides of each island 2 is parallel to the corresponding side of the lead frame 1. The islands 2 are supported by island supports 3. Leads are also supported by tie bars 4. After the chips are mounted on the islands 2, the chips, island support 3 and leads are covered with a mold resin such as epoxy resins. Outer leads of the leads, which extend from the tie bars 4, are exposed, but the chips, bonding wires electrically connected to the leads, inner leads 5, and intermediate leads between the inner leads and outer leads are molded with the resin. Injection molding, transfer molding and dip molding have been known as resin molding techniques. However, transfer molding has been most widely employed.

The number of pins of a multi-chip package has been increasing year after year as electronic devices have the higher density and highly advanced functions. In the case where the number of pins (outer leads) is not so much as shown in FIG. 4, there is no problem. However, when two chips are provided in a package 6 as shown in FIG. 5, a large space may be required for leading intermediate leads located between the two chips. As a result, the package is inevitably elongated, and it is impossible to accommodate the chips in the existing package. If this is forcibly applied to the existing package, the width of each intermediate lead must be reduced, and the leads must be arranged in such a manner that the intermediate leads are greatly bent. Consequently, the strength of leads may be reduced to beak them easily due to shock caused during transfer of the chips after finishing wire bonding and to deform them during resin molding. Thus, problems associated with assembly and reliability may occur.

In addition, in many cases, since the multi-chip packages are combined with existing semiconductor chips, a plurality of electrodes on the chip, i.e. bonding pads, may possibly be arranged non-uniformly. In particular, in chips of bipolar ICs, bonding pads are often arranged non-uniformly, because of the nature of the circuits. When the bonding pads are arranged nonuniformly on the chip, unoccupied space and useless leads 8 may be provided as shown in FIG. 6.

As described above, in the conventional packages, it is difficult to effectively arrange chips having many pins and irregularly arranged boading pads. Thus, the size of the packages may be undesirably increased.

SUMMARY OF THE INVENTION

Therefore, it is an object of the present invention to provide a lead frame suitable for a multi-pin type package.

It is another object of the invention to provide a lead frame having leads without unwanted bends.

It is still another object of the invention to provide a lead frame having leads with reduced bend portions, even if bonding pads are irregularly arranged on a chip.

It is still another object of the invention to provide a lead frame suitable for reduction in size of a package.

According to an aspect of the invention, there is provided a lead frame for a resin-molded semiconductor device, which includes at least first and second square or rectangular islands and a plurality of leads. Each of the islands is arranged in the lead frame so that any one of four sides thereof is not parallel to corresponding one side of the lead frame.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2A is a plan view schematically showing a lead frame accommodated in a package according to a second embodiment of the invention;

FIG. 2B is a plan view schematically showing a lead frame accommodated in a package according to a third embodiment of the invention;

DETAILED DESCRIPTION OF THE PREFERRED EMBODIMENTS

Embodiments of the present invention will now be described with reference to the accompanying drawings.

Figure 1A:
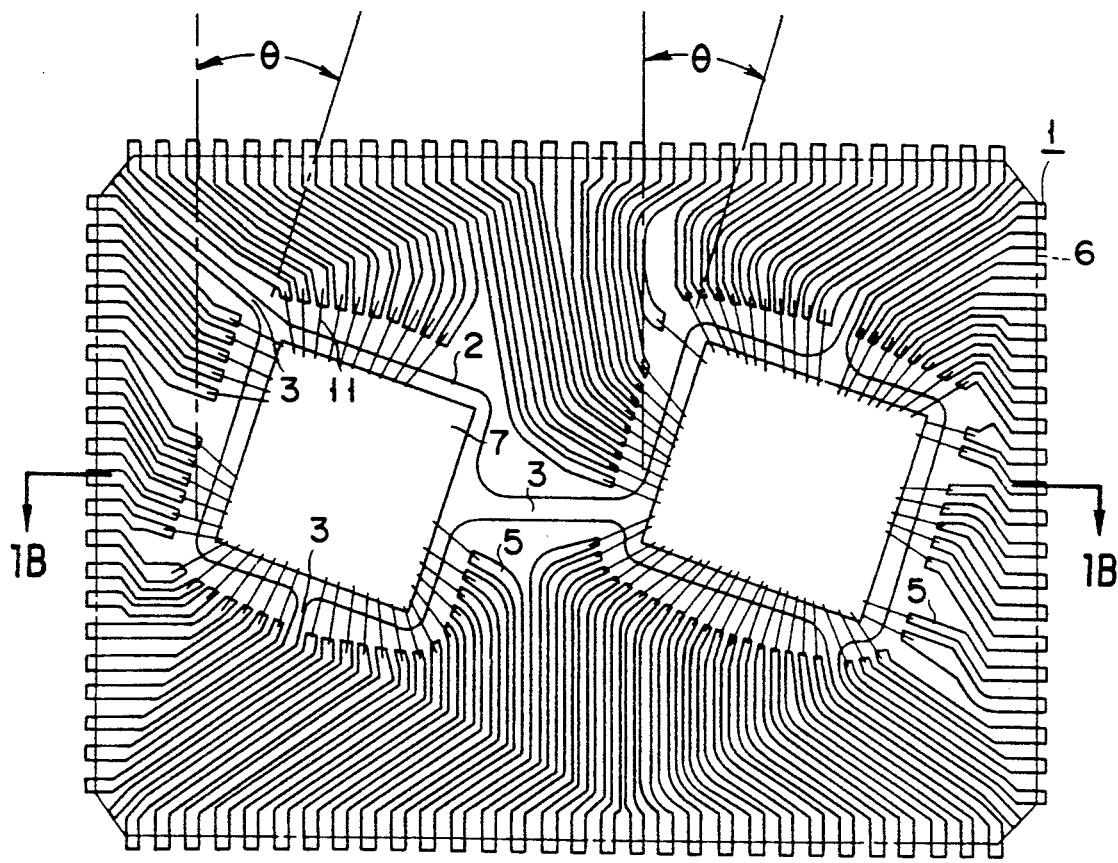
FIG. 1A is a plan view schematically showing a package of a multi-chip type semiconductor device having leads according to a first embodiment of the present invention.
Figure 1B:
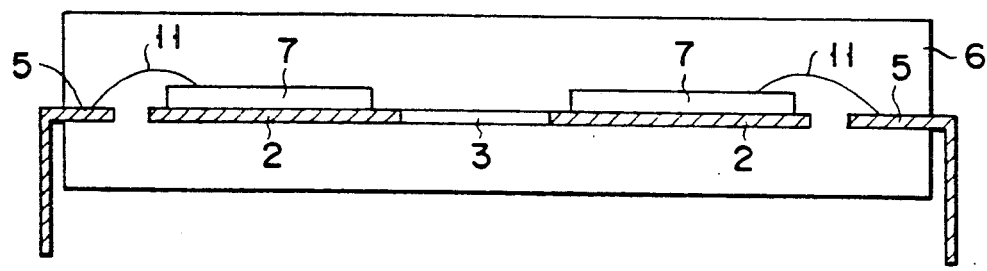
FIG. 1B is a schematical cross-sectional view taken along line A—A in FIG. 1A.

FIGS. 1A and 1B show a multi-chip type semiconductor device according to a first embodiment of the present invention. The semiconductor device is molded with a resin to provide a package 6 indicated by a dot-and-dash line in FIG. 1A. The package 6 comprises a lead frame 1, which includes two rectangular islands 2, island supports 3 for supporting the islands 2, and inner leads 5. Rectangular semiconductor chips 7 are mounted on the islands 2, and bonding wires 11 are provided for electrically connecting bonding pads (not shown) of the chips to the inner leads 5. As seen from FIG. 1A, each side of each island 2 is arranged so as not to be parallel to the corresponding side of the lead frame 1 or package 6. In the first embodiment, the angle $\theta$ between one side of the island 2 and the corresponding side of the lead frame 1 or package 6 is 18°. That is, the angle $\theta$ between the longitudinal axis of the lead frame 1 or package 6 and the center axis of each island is 18°. However, the angle $\theta$ may be set in the range of 0° to 45° (0° is not included).

Of course, when the chip 7 is mounted on the island 2, the opposing sides of the chip and island must be arranged in parallel to one another.

In addition, the manufacture of the lead frame, the assembly of chips and the resin molding process are performed in the same manner as in the prior art.

A second embodiment of the present invention will now be described, with reference to FIG. 2A.

A lead frame has two square islands 2, and the angle $\theta$ between one side of each island 2 and the corresponding side of the lead frame or package 6 is 45°. The two islands 2 are coupled through an island support 3 at their corners.

In the second embodiment, since the faced sides of the two islands 2 are slanted, the space between islands 2 is increased to increase the area occupied by the leads. In addition, it is not necessary to reduce the width of respective leads extremely, and the bent portions of the leads are decreased. Therefore, such a device effectively prevents breaking of the leads due to shock caused during transfer of chips after finishing wire bonding and deforming the leads during resin molding.

A third embodiment of the present invention will now be described with reference to FIG. 2B.

A lead frame has three rectangular islands 2 arranged along its longitudinal axis. The angle $\theta$ between one side of each island 2 and the corresponding side of the lead frame or package 6 is set to a predetermined value. The three islands 2 are coupled to one another by an island support 3 at their side portions. In the third embodiment, rectangular chips are used as semiconductor chips. When the chips are mounted on the islands 2, the facing sides must be mutually arranged in parallel in the same manner as described embodiments.

Figure 2C:
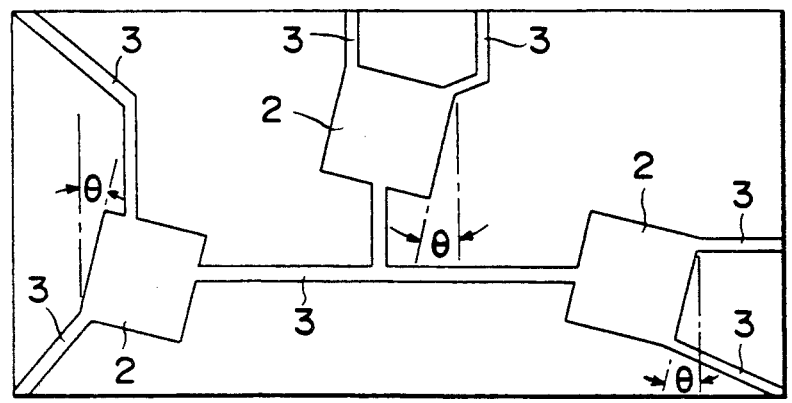
FIG. 2C is a plan view schematically showing a lead frame accommodated in a package according to a fourth embodiment of the invention.

A fourth embodiment of the invention will now be described with reference to FIG. 2C.

A lead frame has a square island 2 located on its longitudinal axis and two square islands 2 arranged on another longitudinal axis thereof. The angle $\theta$ between one side of each island 2 and the corresponding side of the lead frame or the package 6 is set to a predetermined value. The three islands 2 are coupled to one another through an island support 3 at their side portions.

In the second to fourth embodiments, only the arrangements of the islands 2 characterized by the present invention are shown, and the inner leads are omitted.

Figure 3:
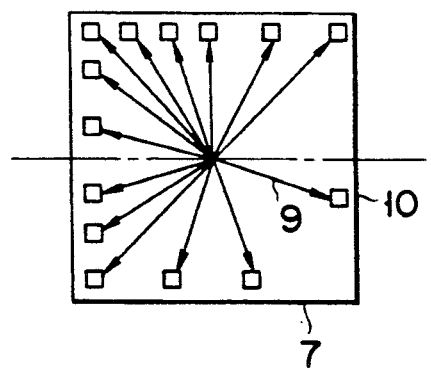
FIG. 3 is a plan view showing a chip capable of being used in the present invention.
Figure 4:
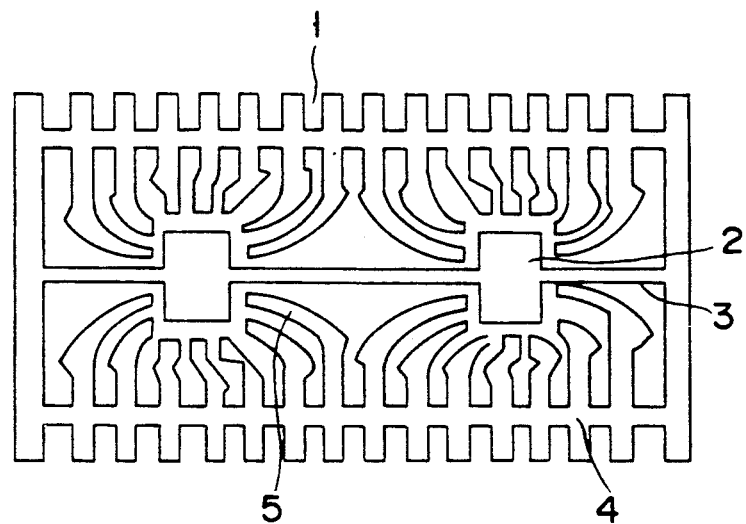
FIG. 4 is a plan view showing a conventional lead frame.
Figure 5:
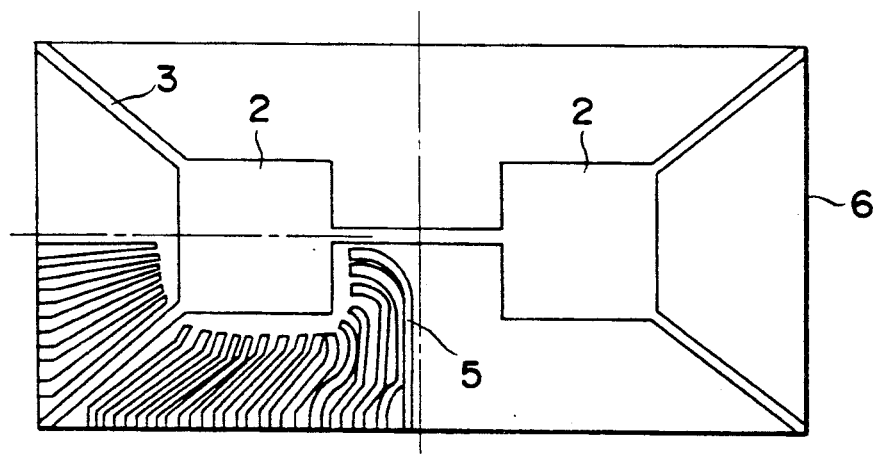
FIG. 5 is a plan view showing a lead frame accommodated in a conventional package.
Figure 6:
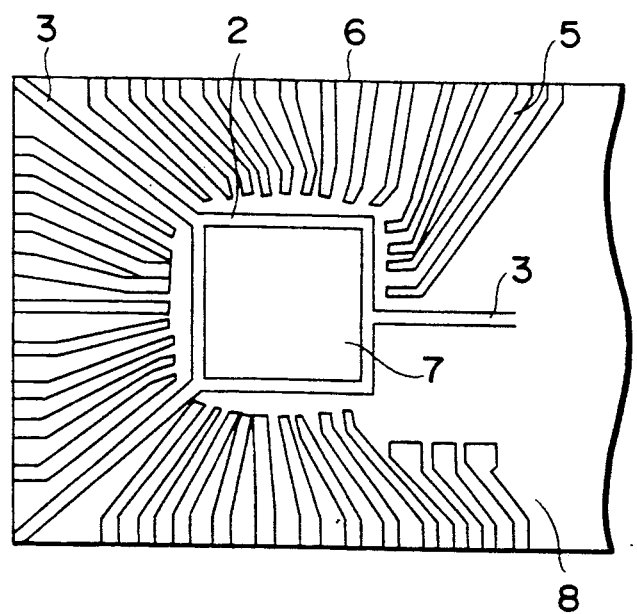
FIG. 6 is a plan view showing a lead frame accommodated in a conventional package.

Normally, bonding pads are regularly arranged on a chip, and there is no necessity for considering the distance among the bonding pads. However, as shown in, for example, FIG. 3, in a bipolar IC, bonding pads 10 are often arranged irregularly on a peripheral portion of chip 7. In this case, the arrangement angle of the islands is determined by the following design technique.

Attention is first paid to the first chip 7. The bonding pads 10 on the chip 7 are regarded as points. Vectors 9 are considered, which represent the distance from the center of the chip 7 to the pads 10 and the directions from the center of chip 7 to pads 10. The total of all vectors 9 is obtained. Regarding a second chip, similar vectors extending from the center of the chip to the bonding pads are considered, and the total of the vectors is then obtained. Two islands are arranged in such a manner that the two total vectors are disposed on a longitudinal axis of the lead frame directed in opposite directions so as to extend from the center of the lead frame towards the outside. Both islands are arranged with an inclination corresponding to the arrangement of the bonding pads on the chips. The inclination may be different between both islands. By arranging the islands according to the design method, the number and quantity of bent portions of the leads can be reduced, and the distance between the islands can be increased. Of course, this design method can be applied to the lead frames of the above embodiments, where necessary.

As has been described above, according to the present invention, the islands are provided such that chips are arranged slantedly with respect to the lead frame. Thus, the length of the intermediate leads between the chips can be reduced, and the bent portions of the leads can be decreased. In addition, even if the number of leads of the chips increases, it is not necessary to increase the size of the package or to reduce the width of each lead extremely. Therefore, a semiconductor device with the improved assembly and reliability can be provided.

Furthermore, even if the bonding pads are arranged irregularly on the chips, the distance between the chips can be kept small, and the size of the packages can be reduced.

It is further understood by those skilled in the art that the foregoing description is only of preferred embodiments of the disclosed lead frame and that various changes and modifications may be made in the invention without departing from the spirit and scope thereof.

What is claimed is:

1. A lead frame for a multichip type semiconductor device comprising:
   a rectangular lead frame member having four straight sides and a longitudinal axis;
   said rectangular lead frame member including a plurality of leads, and further including first and second islands, each having four straight sides and disposed along said longitudinal axis of said rectangular lead frame member; and each of said four straight sides of said first and second islands being inclined relative to an opposing side of said four straight sides of said rectangular lead frame member at an angle $\theta$ given by $0° < \theta \leq 45°$.

2. The lead frame according to claim 1, wherein an angle between one of said four straight sides of said first island and an opposing side of said four straight sides of said rectangular lead frame member is the same as that between one of said four straight sides of said second island and an opposing side of said four straight sides of said rectangular lead frame member.

3. The lead frame according to claim 1, wherein an angle between one of said four straight sides of said first island and an opposing side of said four straight sides of said rectangular lead frame member is different from that between one of said four straight sides of said second island and an opposing side of said four straight sides of said rectangular lead frame member.

4. The lead frame according to claim 1, wherein said angle $\theta$ is given by $18° \leq \theta \leq 45°$.

5. The lead frame according to claim 1, wherein said first and second islands are square in configuration.

6. The lead frame according to claim 1, wherein said first and second islands are rectangular in configuration.

7. A lead frame for a multichip type semiconductor device comprising:
a rectangular lead frame member having four straight sides and first and second longitudinal axes;
said rectangular lead frame member including a plurality of leads, and further including both first and second islands, each having four straight sides and disposed along said first longitudinal axis of said rectangular lead frame member, and a third island having four straight sides and disposed along said second longitudinal axis thereof; and
each of said four straight sides of said first, second and third islands being inclined relative to an opposing side of said four straight sides of said rectangular lead frame member at an angle $\theta$ given by $0° < \theta \leq 45°$.

8. The lead frame according to claim 7, wherein an angle between one of said four straight sides of said first island and an opposing side of said four straight sides of said rectangular lead frame member is the same as that between one of said four straight sides of said second island and an opposing side of said four straight sides of said rectangular lead frame member.

9. The lead frame according to claim 7, wherein an angle between one of said four straight sides of said first island and an opposing side of said four straight sides of said rectangular lead frame member is different from that between one of said four straight sides of said second island and an opposing side of said four straight sides of said rectangular lead frame member.

10. The lead frame according to claim 7, wherein an angle between one of said four straight sides of said first island and an opposing side of said four straight sides of said rectangular lead frame member is the same as that between one of said four straight sides of said third island and an opposing side of said four straight sides of said rectangular lead frame member.

11. The lead frame according to claim 7, wherein an angle between one of said four straight sides of said first island and an opposing side of said four straight sides of said rectangular lead frame member is different from that between one of said four straight sides of said third island and an opposing side of said four straight sides of said rectangular lead frame member.

12. The lead frame according to claim 7, wherein said angle $\theta$ is given by $18° \leq \theta \leq 45°$.

13. The lead frame according to claim 7, wherein said first, second and third islands are square in configuration.

14. The lead frame according to claim 7, wherein said first, second and third islands are rectangular in configuration.

15. A resin molded semiconductor device comprising:
a rectangular lead frame member having four straight sides and a longitudinal axis;
said rectangular lead frame member including a plurality of leads, and further including first and second islands, each having four straight sides and disposed along said longitudinal axis of said rectangular lead frame member;
each of said four straight sides of said first and second islands being inclined relative to an opposing side of said four straight sides of said rectangular lead frame member at an angle $\theta$ given by $0° < \theta 45°$; and
semiconductor chips, each having four straight sides and mounted on said first and second islands such that each of said four straight sides of said chips is arranged in parallel to an opposing side of said four straight sides of said first and second islands.

16. The resin molded semiconductor device according to claim 15, wherein an angle between one of said four straight sides of said first island and an opposing side of said four straight sides of said rectangular lead frame member is the same as that between one of said four straight sides of said second island and an opposing side of said four straight sides of said rectangular lead frame member.

17. The resin molded semiconductor device according to claim 15, wherein an angle between one of said four straight sides of said first island and an opposing side of said four straight sides of said rectangular lead frame member is different from that between one of said four straight sides of said second island and an opposing side of said four straight sides of said rectangular lead frame member.

18. The resin molded semiconductor device according to claim 15, wherein said angle $\theta$ is given by $18° \leq \theta \leq 45°$.

19. The resin molded semiconductor device according to claim 15, wherein each of said chips has a peripheral portion and bonding pads densely and regularly located on said peripheral portion.

20. The resin molded semiconductor device according to claim 15, wherein each of said chips has a peripheral portion and bonding pads non-densely and irregularly located on said peripheral portion.

21. The resin molded semiconductor devices according to claim 20, wherein each of said chips are mounted on said first and second islands in such a manner that bonding pads of one of said chips, non-densely and irregularly located at said peripheral portion, are opposed to those of the other of said chips.

* * * * *

UNITED STATES PATENT AND TRADEMARK OFFICE
CERTIFICATE OF CORRECTION

PATENT NO. :  5,126,823
DATED      :  June 30, 1992
INVENTOR(S):  Masashi Otsuka et al.

It is certified that error appears in the above-identified patent and that said Letters Patent is hereby corrected as shown below:

Claim 15, column 6, line 25, change "$\theta 45°$" to --$\theta \leq 45°$--.

Claim 21, column 6, line 58, change "devices" to --device--.

Signed and Sealed this

Fourth Day of January, 1994

Attest:

BRUCE LEHMAN

*Attesting Officer*        *Commissioner of Patents and Trademarks*